United States Patent
Noda et al.

(10) Patent No.: US 10,879,669 B2
(45) Date of Patent: Dec. 29, 2020

(54) PHOTONIC CRYSTAL LASER

(71) Applicants: KYOTO UNIVERSITY, Kyoto (JP); NATIONAL UNIVERSITY CORPORATION KYOTO INSTITUTE OF TECHNOLOGY, Kyoto (JP)

(72) Inventors: Susumu Noda, Kyoto (JP); Kyoko Kitamura, Kyoto (JP); Masako Yone, Kyoto (JP)

(73) Assignees: KYOTO UNIVERSITY, Kyoto (JP); NATIONAL UNIVERSITY CORPORATION KYOTO INSTITUTE OF TECHNOLOGY, Kyoto (JP)

( * ) Notice: Subject to any disclaimer, the term of this patent is extended or adjusted under 35 U.S.C. 154(b) by 0 days.

(21) Appl. No.: 16/488,998

(22) PCT Filed: Feb. 27, 2018

(86) PCT No.: PCT/JP2018/007246
§ 371 (c)(1),
(2) Date: Aug. 27, 2019

(87) PCT Pub. No.: WO2018/159606
PCT Pub. Date: Sep. 7, 2018

(65) Prior Publication Data
US 2020/0028322 A1     Jan. 23, 2020

(30) Foreign Application Priority Data
Feb. 28, 2017   (JP) ................................. 2017-035887

(51) Int. Cl.
*H01S 5/10* (2006.01)
*H01S 5/026* (2006.01)
*H01S 5/062* (2006.01)

(52) U.S. Cl.
CPC ............ *H01S 5/105* (2013.01); *H01S 5/0267* (2013.01); *H01S 5/06243* (2013.01)

(58) Field of Classification Search
CPC .................................. H01S 5/105; H01S 5/18
See application file for complete search history.

(56) References Cited

U.S. PATENT DOCUMENTS

2007/0030873 A1   2/2007  Deng
2007/0217466 A1   9/2007  Noda et al.
(Continued)

FOREIGN PATENT DOCUMENTS

CN        105191029 A      12/2015
DE    112014001143 15      11/2015
(Continued)

OTHER PUBLICATIONS

May 15, 2018 International Search Report issued in International Patent Application No. PCT/JP2018/007246.
(Continued)

*Primary Examiner* — Michael Carter
(74) *Attorney, Agent, or Firm* — Oliff PLC

(57) ABSTRACT

A photonic crystal laser 10 is a laser that has a configuration, in which a light emitting layer (an active layer 12) that generates light including light of wavelength $\lambda_L$, and a two-dimensional photonic crystal layer 11 including different refractive index regions (holes 111) disposed two-dimensionally on a plate-like base material 112, the different refractive index regions having a refractive index different from a refractive index of the base material, so that a refractive index distribution is formed, are stacked. Each different refractive index region in the two-dimensional photonic crystal layer 11 is disposed at a position shifted from each lattice point of a basic two-dimensional lattice that has periodicity defined to generate a resonant state of (Continued)

light of the wavelength $\lambda_L$ by forming a two-dimensional standing wave and not to emit light of the wavelength $\lambda_L$ to outside. A positional shift vector $\Delta \vec{r}$ representing the shift of the position of the different refractive index region at the each lattice point from the lattice point is expressed by $$\Delta \vec{r} = d \cdot \sin(\pm \vec{G'} \cdot \vec{r} + \psi_0) \cdot (\cos(L(\varphi+\varphi_0)), \sin(L(\varphi+\varphi_0)))$$

by using a wave number vector $\vec{k} = (k_x, k_y)$ of light of the wavelength $\lambda_L$ in the two-dimensional photonic crystal layer 11, an effective refractive index $n_{eff}$ of the two-dimensional photonic crystal layer, an azimuth angle $\varphi$ from a predetermined reference line extending in a predetermined direction from a predetermined origin of the basic two-dimensional lattice, an arbitrary constant $\varphi_0$, and a reciprocal lattice vector $\vec{G'} = \pm (k_x \pm |\vec{k}|(\sin\theta\cos\varphi)/n_{eff}, k_y \pm |\vec{k}|(\sin\theta\sin\varphi)/n_{eff})$ expressed by using a spread angle $\theta$ of a laser beam, the position vector $\vec{r}$ of the each lattice point, arbitrary constants $d$ and $\psi_0$, and an integer $L$ excluding 0.

9 Claims, 9 Drawing Sheets

(56) References Cited

U.S. PATENT DOCUMENTS

| | | | |
|---|---|---|---|
| 2009/0135871 A1 | 5/2009 | Noda et al. | |
| 2009/0285255 A1 | 11/2009 | Sakai et al. | |
| 2013/0243026 A1 | 9/2013 | Noda et al. | |
| 2014/0348195 A1 | 11/2014 | Sakaguchi et al. | |
| 2016/0020580 A1 | 1/2016 | Takiguchi et al. | |
| 2016/0036201 A1 | 2/2016 | Takiguchi et al. | |
| 2016/0261093 A1 | 9/2016 | Noda et al. | |
| 2018/0109075 A1* | 4/2018 | Kurosaka | H01S 5/18358 |

FOREIGN PATENT DOCUMENTS

| | | |
|---|---|---|
| DE | 11 2014 001152 15 | 11/2015 |
| DE | 11 2016 001195 15 | 11/2017 |
| EP | 1998419 A1 | 12/2008 |
| EP | 1998420 A1 | 12/2008 |
| EP | 2966737 A1 | 1/2016 |
| GB | 2428887 A | 2/2007 |
| JP | 2007-258260 A | 10/2007 |
| JP | 2007-258261 A | 10/2007 |
| JP | 2007-258262 A | 10/2007 |
| JP | 2013-211542 A | 10/2013 |
| JP | 2014-197665 A | 10/2014 |
| JP | 6080941 B2 | 2/2017 |
| JP | 6276750 B2 | 2/2018 |
| WO | 2007/108218 A1 | 9/2007 |
| WO | 2007/119273 A1 | 10/2007 |
| WO | 2011/108510 A1 | 9/2011 |
| WO | 2014/136607 A1 | 9/2014 |
| WO | 2014/136955 A1 | 9/2014 |
| WO | 2014/136962 A1 | 9/2014 |
| WO | 2016/148075 A1 | 9/2016 |

OTHER PUBLICATIONS

Sep. 3, 2019 International Preliminary Report on Patentability issued in International Patent Application No. PCT/JP2018/007246.
"Z-Polarizing Element". Nanophoton Corporation, 2005, <URL: http://www.nanophoton.jp/products/zpol/index.html>.

* cited by examiner

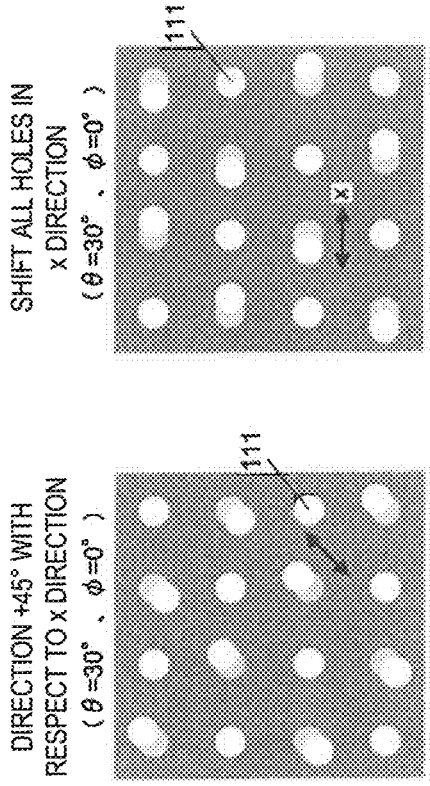
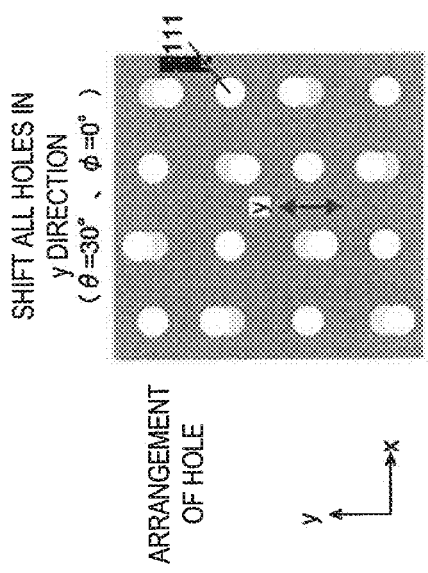
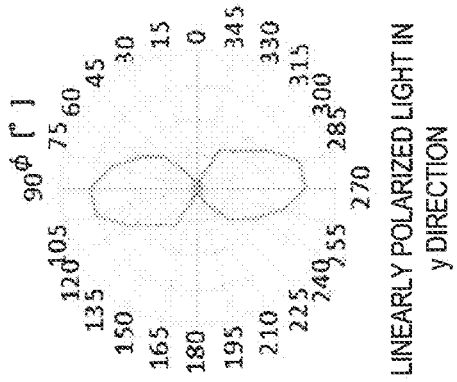
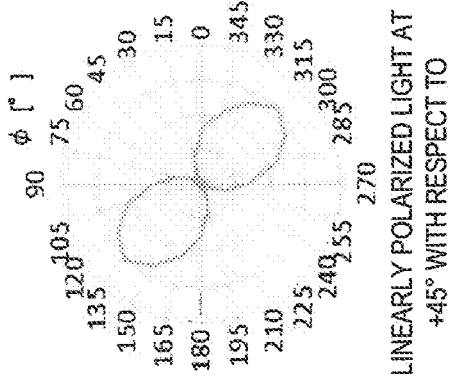
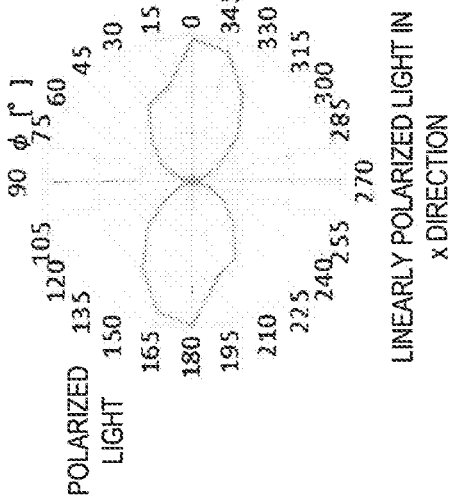
Fig. 5A  Fig. 5B  Fig. 5C $\theta = 30°$, $\phi = 0°$ SHIFT ALL HOLES IN x DIRECTION $\theta = 30°$, $\phi = 45°$ SHIFT ALL HOLES IN x DIRECTION $\theta = 30°$, $\phi = 90°$ SHIFT ALL HOLES IN x DIRECTION L = +1, $\phi_0$ = 90° (RADIALLY POLARIZED ANNULAR LIGHT)

* SIDE LOBE IS BLOCKED

L = -1, $\phi_0$ = 90°

* NO SIDE LOBE

L = +1, $\phi_0$ = 90°
(RADIALLY POLARIZED ANNULAR LIGHT)

PORTION THAT HAS PASSED THROUGH POLARIZING PLATE

DIRECTION OF POLARIZED LIGHT THAT CAN PASS THROUGH POLARIZING PLATE

DIRECTION OF POLARIZED LIGHT AT EACH POSITION

* SIDE LOBE IS BLOCKED

* NO SIDE LOBE $L=-1, \phi_0=90°, \theta=1°$

FF 12.0%

$L=-1, \phi_0=90°, \theta=8°$

FF 14.0%

PHOTONIC CRYSTAL LASER

TECHNICAL FIELD

The present invention relates to a photonic crystal laser suitable for generating a laser beam having a small spot diameter used, for example, for fine processing when an integrated circuit and the like are manufactured, and for analysis of a minute portion of a sample.

BACKGROUND ART

As a laser light source used for fine processing or analysis of a minute portion of a sample, it is required to focus the laser beam to a point as small as possible in order to enhance the precision of the processing or analysis. However, the spot diameter of the laser beam cannot be made smaller than a diffraction limit value determined by a wavelength of laser and a numerical aperture of a focusing lens by simply focusing the laser beam with the focusing lens.

Patent Literature 1 describes a laser having an active layer and a photonic crystal (photonic crystal laser) that generates a laser beam suitable for reducing the spot diameter. In a photonic crystal laser, light is generated by injecting electric current into the active layer, and only light of a specific wavelength corresponding to a period of a refractive index of the photonic crystal is selectively amplified by interference among the light generated in the active layer, whereby laser oscillation is performed. Generally, the period of a refractive index in this photonic crystal is approximately the same as the wavelength of light. In the photonic crystal laser described in Patent Literature 1, the photonic crystal has a plate-like base material, in which different refractive index regions, which are regions having a refractive index different from the refractive index of the base material, are disposed in a ring shape so as to be arranged periodically in a circumferential direction of the ring. Each of the different refractive index regions has an asymmetrical shape with respect to an axis that passes through its center and extends radially of the ring. With such a structure of the photonic crystal, as shown in FIG. 15A, the photonic crystal laser described in Patent Literature 1 emits a laser beam that has a cross section 81 in a ring shape and whose light is polarized radially of the ring (a direction indicated by an arrow in FIG. 15A). Hereinafter, such a laser beam will be referred to as a "radially polarized annular laser beam".

By focusing such a radially polarized annular laser beam, an electric field in an optical axis direction is generated near the focal point, and a laser beam with a beam diameter smaller than a diffraction limit value can be obtained. Conventionally, a small beam diameter has been obtained only in a very short region of about 1 wavelength in the optical axis direction. However, by using a radially polarized annular laser beam, such small beam diameter can be obtained in a longer region of 10 wavelengths or more.

Further, as shown in FIG. 15B, when a radially polarized annular laser beam is focused by a lens 83, a ring-shaped portion of the laser beam is refracted, and a component of an electric field of radially polarized light is generated in a direction (z direction) parallel to the laser beam. The polarized light having such a component has an advantage, for example, in Raman scattering measurement (see Non Patent Literature 1); scattering can be observed that does not occur in a case where polarized light perpendicular to a laser beam is used.

CITATION LIST

Patent Literature

Patent Literature 1: WO 2011/108510 A
Patent Literature 2: WO 2014/136607 A
Patent Literature 3: JP 2014-197665 A

Non Patent Literature

Non Patent Literature 1: "Z-polarizing element", [online], 2005, Nanophoton Corporation, [searched Feb. 13, 2017], Internet

SUMMARY OF INVENTION

Technical Problem

The photonic crystal laser described in Patent Literature 1 uses a photonic crystal in which different refractive index regions are arranged in a ring shape in a plate-like base material. For this reason, light generated by an active layer is amplified only in the ring shape portion of the base material. For that reason, in the photonic crystal laser described in Patent Literature 1, it is difficult to have a large output power of the laser. Further, in this photonic crystal laser, since the length of a resonator is generally long, there arises a case where laser oscillation occurs only in a part of the ring shape portion in which the different refractive index regions are disposed, which impairs the uniformity, and a perfect radially polarized annular laser beam cannot be obtained.

The problem to be solved by the present invention is to provide a photonic crystal laser capable of obtaining an annular laser beam having various types of polarized light, including a radially polarized annular laser beam whose output is larger in power and more complete than a conventional one.

Solution to Problem

Recently, there has been proposed a photonic crystal laser that includes a two-dimensional photonic crystal, in which different refractive index regions having a different refractive index from a refractive index of a base material are disposed in a two-dimensional lattice (square lattice, triangular lattice, or the like) shape in a plate-like base material. A variation of this photonic crystal laser is disclosed in Patent Literature 2, in which the different refractive index region is disposed at a position shifted in one specific direction from a lattice point of the two-dimensional lattice having a predetermined period determined corresponding to a predetermined wavelength generated in an active layer, and the magnitude of the shift is changed periodically according to the position of the lattice point. In this manner, it has been revealed that a laser beam that has linearly polarized light in a direction perpendicular to the one direction and is emitted in a direction inclined with respect to the normal line of a surface of the base material can be obtained. However, the cross sectional shape of the laser beam obtained by this photonic crystal laser is not a ring shape, and the polarized light is linearly polarized light as described above, not a radially polarized light. The inventor of the present invention has found that, in this photonic crystal laser, by shifting the different refractive index region in a direction (two-dimensionally) different for each lattice point, instead of disposing by shifting the different refractive index region in a specific one direction from a lattice point, a laser beam having various forms of polarized light, including radially polarized light, can be obtained. Further, the inventor has also found that an annular laser beam can be obtained by further changing the magnitude of the shift from the lattice point, in addition to changing it periodically according to the position of the lattice point. These findings have completed the present invention.

That is, a photonic crystal laser according to the present invention is a laser that has a configuration, in which a light emitting layer that generates light including light of wavelength $\lambda_L$, and a two-dimensional photonic crystal layer including different refractive index regions disposed two-dimensionally on a plate-like base material, the different refractive index regions having a refractive index different from a refractive index of the base material, so that a refractive index distribution is formed, are stacked.

Each different refractive index region in the two-dimensional photonic crystal layer is disposed at a position shifted from each lattice point of a basic two-dimensional lattice that has periodicity defined to generate a resonant state of light of the wavelength $\lambda_L$ by forming a two-dimensional standing wave and not to emit light of the wavelength $\lambda_L$ to outside.

Magnitude of the shift of the position of the different refractive index region at the each lattice point from the lattice point has modulation in which the magnitude of the shift changes in a predetermined period from a predetermined origin of the basic two-dimensional lattice in a radial direction and in a predetermined period from the predetermined origin in a circumferential direction, and a direction of the shift from the lattice point is different depending on the direction of a straight line connecting the origin and the lattice point.

The predetermined origin can be set at an arbitrary position. The predetermined period of modulation in the radial direction, and the predetermined period of modulation in the circumferential direction can be set at arbitrary values respectively.

The photonic crystal laser according to the present invention can also be expressed as follows. That is, a photonic crystal laser according to the present invention has a configuration, in which a light emitting layer that generates light including light of wavelength $\lambda_L$, and a two-dimensional photonic crystal layer including different refractive index regions disposed two-dimensionally on a plate-like base material, the different refractive index regions having a refractive index different from a refractive index of the base material, so that a refractive index distribution is formed, are stacked.

Each different refractive index region in the two-dimensional photonic crystal layer is disposed at a position shifted from each lattice point of a basic two-dimensional lattice that has periodicity defined to generate a resonant state of light of the wavelength $\lambda_L$ by forming a two-dimensional standing wave and not to emit light of the wavelength $\lambda_L$ to outside, and a positional shift vector $\Delta r\uparrow$ representing the shift of the position of the different refractive index region at each lattice point from the lattice point is expressed by $$\Delta r\uparrow = d \cdot \sin(\pm G'\uparrow \cdot r\uparrow + \psi_0) \cdot (\cos(L(\varphi+\varphi_0)), \sin(L(\varphi+\varphi_0))) \quad (1)$$

using a wave number vector $k\uparrow = (k_x, k_y)$ of light of the wavelength $\lambda_L$ in the two-dimensional photonic crystal layer, an effective refractive index $n_{eff}$ of the two-dimensional photonic crystal layer, an azimuth angle $\varphi$ from a predetermined reference line extending in a predetermined direction from a predetermined origin of the basic two-dimensional lattice, an arbitrary constant $\varphi_0$, and a reciprocal lattice vector $G'\uparrow = \pm(k_x \pm |k\uparrow|(\sin\theta\cos\varphi)/n_{eff}, k_y \pm |k\uparrow|(\sin\theta\sin\varphi)/n_{eff})$ expressed by using a spread angle $\theta$ of a laser beam, the position vector $r\uparrow$ of the each lattice point, arbitrary constants $d$ and $\psi_0$, and an integer L excluding 0.

In Equation (1), $\sin(\pm G'\uparrow \cdot r\uparrow + \psi_0)$ represents modulation that changes in the predetermined period in a radial direction from a predetermined origin of the basic two-dimensional lattice described above. Further, $\varphi_0$ in Equation (1) corresponds to the predetermined angle.

The wavelength $\lambda_L$ is defined as the wavelength in vacuum. Light of wavelength $\lambda_L$ has a wavelength of $\lambda_L/n_{eff}$ in the two-dimensional photonic crystal layer. The effective refractive index $n_{eff}$ is a refractive index in consideration of the ratio of electric field intensity of light distributed in the two-dimensional photonic crystal layer in a structure in which the above layers are stacked, and a filling rate of the different refractive index region with respect to the base material. Note that, in addition to the light emitting layer and the two-dimensional photonic crystal layer, the photonic crystal laser according to the present invention may have a cladding layer, a spacer layer, and the like.

In the photonic crystal laser according to the present invention, in order to emit a radially polarized annular laser beam, a value of L in Equation (1) is set to +1, and the value of $\varphi_0$ is set to 90°.

On the other hand, if the value of L in Equation (1) is set to +1 and $\varphi_0$ is set to 0°, an azimuthally polarized annular laser beam polarized in a circumferential direction of the ring in the cross section of the laser beam is obtained. Furthermore, in addition to the radially polarized light and the azimuthally polarized light, an annular laser beam having polarized light that has the same polarizing direction at every azimuthal position of $(360/L)°$ in the circumferential direction of the ring shape can be obtained by setting the value of L appropriately. An annular laser beam having such various types of polarized light can be used as an optical tweezer for holding a minute object by a light focusing field formed by focusing the light, as a light source of a light recording device that records data at high density by the light focusing field, as a light source of a microscope capable of high-resolution observation, or for applications, such as optical modeling.

In the present invention, the basic two-dimensional lattice has a structure that forms a resonant state of light of the wavelength $\lambda_L$ and does not emit the light of the wavelength $\lambda_L$ to the outside as described in subsequent paragraphs. In this manner, it is possible to prevent a laser beam having a wavelength of the predetermined value $\lambda_L$ but not having predetermined polarized light or a laser beam having a cross section which is not a ring shape from being emitted from the photonic crystal laser. At the same time, the different refractive index region is shifted, from a lattice point, with the magnitude having modulation that changes in the predetermined period in the radial direction from the predetermined origin of the basic two-dimensional lattice, in a direction that forms a predetermined angle with a straight line connecting the origin and the lattice point (to a position represented by a positional shift vector $\Delta r\uparrow$ from each lattice point), so that a radially polarized annular laser beam is emitted. Hereinafter, (a) positional shift from the lattice point of the different refractive index region, and (b) basic two-dimensional lattice will be described in detail.

(a) Positional Shift from the Lattice Point of the Different Refractive Index Region In the photonic crystal laser of Patent Literature 2, at each lattice point of the basic two-dimensional lattice whose position is represented by a position vector r↑, the different refractive index region is disposed at a position shifted in one direction by a distance of d sin(G'↑·r↑) from the lattice point. Here, the distance d sin(G'↑·r↑) represents modulation that changes in a predetermined period in a radial direction from a predetermined origin of the basic two-dimensional lattice. However, there is no change in the predetermined period in the circumferential direction. Further, in Patent Literature 2, the angle θ included in the distance d sin(G'↑·r↑) represents an inclination angle of a laser beam with respect to the normal line of the base material, and the angle φ indicates an azimuth angle of a laser beam. In this manner, in the photonic crystal laser of Patent Literature 2, the laser beam having linearly polarized light in the direction perpendicular to the one direction and inclined at the inclination angle θ with respect to the normal line of the surface of the base material is emitted in a direction at the azimuth angle φ. On the other hand, the photonic crystal laser of Patent Literature 2 does not employ the configuration where the different refractive index region is shifted in one direction from the lattice point, and the direction of the shift forms a predetermined angle with the straight line connecting the origin and the lattice point as described above.

In contrast, in the photonic crystal laser according to the present invention, the magnitude of the shift of the different refractive index region from the lattice point at each lattice point changes in a predetermined period in the radial direction from the predetermined origin of the basic two-dimensional lattice, and also changes in a predetermined period (which does not need to be the same as the period in the radial direction) toward the circumferential direction. In this manner, the shape of the cross section of the obtained laser beam becomes a ring shape. In Equation (1), the positional shift vector Δr↑ is obtained by multiplying a factor d sin(±G'↑·r↑+ψ$_0$) representing the magnitude of the shift by a vector (cos(L(φ+φ$_0$)), sin(L(φ+φ$_0$))) representing a direction of the shift, and when |r↑| representing a distance from the origin and the azimuth angle φ representing the change in the circumferential direction are changed, the factor d sin(±G'↑·r↑+ψ$_0$) representing the magnitude of the shift changes periodically. On the other hand, the angle θ included in the positional shift vector Δr↑ is a constant not depending on the lattice point, and a corresponding constant can also be specified in modulation that changes in a predetermined period in the radial direction and the circumferential direction from the predetermined origin of the basic two-dimensional lattice described above. In this manner, the generated laser beam has a conical surface shape formed by rotating a straight line having the inclination angle θ around the normal line of the surface of the base material. A cross section of the laser beam of this shape is a ring shape. Note that the annular laser beam spreads at the angle θ as a distance from the photonic crystal laser increases, and the diameter increases. However, the spread can be suppressed by setting θ to a sufficiently small value.

Further, the direction of the shift of the different refractive index region from the lattice point at each lattice point varies depending on the direction of the straight line connecting the origin and the lattice point, so that polarized light in directions that vary depending on positions of the obtained laser beam in the ring can be obtained. In terms of Equation (1), the vector (cos(L(φ+φ$_0$)), sin(L(φ+φ$_0$))) representing the direction of the shift in the positional shift vector Δr↑ has a period of (360/L)°, so that it is possible to obtain polarized light in which the direction of linearly polarized light makes one rotation in a period of (360/L)° in the circumferential direction of the ring in the cross section of the laser beam. For example, in a case of L=±1, the polarized light makes one rotation each time of advancement by 360° (that is, one rotation) in the circumferential direction of the ring. Here, in the case of L=+1, when φ$_0$=90°, the direction of linearly polarized light becomes radial regardless of the circumferential position of the ring, and a radially polarized laser beam can be obtained. In the case of L=+1, when φ$_0$=0, the direction of linearly polarized light is circumferential regardless of the circumferential position of the ring, and an annular laser beam of azimuthally polarized light can be obtained.

As described above, the photonic crystal laser according to the present invention can obtain a laser beam that has a cross section in a ring shape and has polarized light in which the direction of linearly polarized light makes one rotation in a period of (360/L)° in the circumferential direction of the ring. Then, a radially polarized annular laser beam is obtained in a case where L=+1 and φ$_0$=90°, and an azimuthally polarized annular laser beam is obtained in a case where L=+1 and φ$_0$=0.

Note that Patent Literature 3 describes that, in the photonic crystal laser, a perturbation is applied to a lattice point for forming a resonant state. However, the perturbation in Patent Literature 3 is for making the size and depth of a planar shape of a different refractive index region (hole) different for each different refractive index region, or placing another lattice for forming a perturbation state, which is another lattice, on top of a lattice for forming a resonant state, and is not described to shift the position of the different refractive index region from the lattice point. Further, Patent Literature 3 does not describe neither that a laser beam having a cross section in a ring shape can be obtained, nor that it relates to polarization.

(b) Basic Two-Dimensional Lattice

The basic two-dimensional lattice, that is, a two-dimensional lattice that forms a resonant state of light of the wavelength $\lambda_L$ and does not emit the light of wavelength $\lambda_L$ to the outside is conventionally known. As one example of the basic two-dimensional lattice, there is a square lattice whose lattice constant a is $$a = 2^{-1/2}\lambda_L/n_{\mathit{eff}} = 2^{-1/2}\lambda_{PC}.$$

Also, a rectangular lattice (including a face-centered rectangular lattice) whose lattice constants $a_1$ and $a_2$ satisfy a relational expression of $$(\tfrac{1}{2}) \times (a_1^{-2} + a_2^{-2})^{1/2} = 1/\lambda_{PC}$$

and a triangular lattice whose lattice consonant a is $$a = (\tfrac{2}{3})\lambda_{PC}$$

are also included in examples of the basic two-dimensional lattices.

A reason that such a basic two-dimensional lattice amplifies light of the wavelength $\lambda_L$ and does not emit the light of the wavelength $\lambda_L$ will be described using FIG. 1 by exemplifying a case of a square lattice satisfying the above equation $a = 2^{-1/2}\lambda_{PC}$.

In the two-dimensional photonic crystal layer, when a different refractive index region is disposed at a lattice point 91 of a square lattice of a basic two-dimensional lattice 90, light of the wavelength $\lambda_{PC}$ in the crystal layer is scattered in various directions. Of the scattered light, light L1 scattered (180° scattering) in a direction 180° different from a traveling direction before scattering at one certain lattice point 911 is amplified by interference, since an optical path difference from light L2 scattered by 180° at four lattice points 912 closest to the lattice point 911 matches the wavelength $\lambda_{PC}$ in a crystal layer (FIG. 1A. In this diagram, only the light L2 scattered by one of the lattice points 912 is shown). Further, light L3 scattered (90° scattering) in a direction 90° different from a traveling direction before scattering in a lattice plane at the lattice point 911 is amplified by interference, since an optical path difference from light L4 scattered by 90° in a lattice plane at four of the lattice points 912 matches the wavelength $\lambda_{PC}$ in the crystal layer (FIG. 1A). As described above, a two-dimensional standing wave is formed by both 180° scattering and 90° scattering, and light is amplified.

On the other hand, light of the wavelength $\lambda_{PC}$ in the crystal layer propagating in the two-dimensional photonic crystal layer is also scattered at the lattice point 91 in a direction at an angle to the layer. However, of such scattered light, light that is scattered at the lattice point 911 and light scattered at the lattice point 912 cancel each other, since an optical path difference between them becomes $\lambda_{PC}/2$ (light L5 and light L6 in FIG. 1B), and phases of the light are shifted by 180°. Therefore, light is not emitted to the outside of the two-dimensional photonic crystal layer.

Here, the case where the basic two-dimensional lattice is a square lattice has been described as an example, but the above similarly applies to a rectangular lattice. A case where the basic two-dimensional lattice is a triangular lattice (hexagonal lattice) is similar to the case of the square lattice, except that light amplified by interference is light that is scattered (120° scattering) in a direction different from the traveling direction before scattering in the lattice plane by 120°.

When the basic two-dimensional lattice is a square lattice with the lattice constant a, a reciprocal lattice vector $G'\uparrow (= (g'_x, g'_y))$ is

[Equation 1]

$$g'_x = \pm \left( \frac{1}{2} \pm \frac{1}{\sqrt{2}\, n_{eff}} \sin\theta \cos\phi \right) \cdot \frac{2\pi}{a} \quad (2)$$

$$g'_y = \pm \left( \frac{1}{2} \pm \frac{1}{\sqrt{2}\, n_{eff}} \sin\theta \sin\phi \right) \cdot \frac{2\pi}{a}$$

Further, in a case where the basic two-dimensional lattice is a rectangular lattice with the lattice constants $a_1$ and $a_2$, the reciprocal lattice vector $G'=(g'_x, g'_y)$ is

[Equation 2]

$$g'_x = \pm \left( \frac{1}{a_1} \pm \sqrt{\frac{1}{a_1^2} + \frac{1}{a_2^2}} \, \frac{\sin\theta \cos\phi}{n_{eff}} \right) \cdot \pi \quad (3)$$

$$g'_y = \pm \left( \frac{1}{a_2} \pm \sqrt{\frac{1}{a_1^2} + \frac{1}{a_2^2}} \, \frac{\sin\theta \sin\phi}{n_{eff}} \right) \cdot \pi$$

On the other hand, in a case where the basic two-dimensional lattice is a triangular lattice with the lattice constant a, the reciprocal lattice vector $G'=(g'_x, g'_y)$ can be a combination of either

[Equation 3]

$$g'_x = \pm \left( 1 \pm \frac{\sin\theta \cos\phi}{n_{eff}} \right) \cdot \frac{4\pi}{3a} \quad (4)$$

$$g'_y = \pm \frac{\sin\theta \cos\phi}{n_{eff}} \cdot \frac{4\pi}{3a}$$

or

[Equation 4]

$$g'_x = \pm \left( 1 \pm 2 \frac{\sin\theta \cos\phi}{n_{eff}} \right) \cdot \frac{2\pi}{3a} \quad (5)$$

$$g'_y = \pm \left( \sqrt{3} \pm 2 \frac{\sin\theta \sin\phi}{n_{eff}} \right) \cdot \frac{2\pi}{3a}.$$

By substituting the reciprocal lattice vector G' in each of the basic unit lattices into Equation (1), the positional shift vector $\Delta r\uparrow$ at each lattice point of the basic unit lattice can be obtained.

The configuration of the photonic crystal laser according to the present invention has been described so far. According to this configuration, the different refractive index regions are two-dimensionally disposed, so that a range in which light can be amplified can be widened as compared with the conventional photonic crystal laser in which the different refractive index regions are disposed only in a ring-shaped range. Accordingly, the output power can be increased. Further, since the different refractive index regions are two-dimensionally disposed, local laser oscillation is less likely to occur, and a more complete radially polarized annular laser beam can be obtained.

In the photonic crystal laser according to the present invention, a light emitting layer is an active layer that emits light when current is injected, which is typically widely used in conventional lasers. However, the light emitting layer is not limited to such an active layer, as long as the light emitting layer generates light containing light of the wavelength $\lambda_L$.

The different refractive index region can be realized by forming a hole in the base material. Alternatively, the different refractive index region may be realized by embedding, in the base material, a member having a refractive index different from a refractive index of the base material. The planar shape of the different refractive index region may take various shapes, such as a circular shape, a triangular shape, and other polygonal shapes. However, the plane shape is preferably a circular shape in terms of good symmetry, in order to make the cross section of the laser beam more uniform in the circumferential direction of the ring. In terms of good symmetry, instead of a circle shape, the planar shape may be a polygon with six or more vertices.

Advantageous Effects of Invention

The present invention realizes a photonic crystal laser capable of obtaining an annular laser beam having various types of polarized light, such as a radially polarized annular laser beam whose output is larger in the power and more complete than a conventional one.

BRIEF DESCRIPTION OF DRAWINGS

FIG. 5 is a top view (upper diagram) of the two-dimensional photonic crystal layer and a diagram showing a result (lower diagram) obtained by measuring a polarization direction for three examples in which values of an inclination angle θ and an azimuth angle φ are the same and directions of shift of the holes are different.

DESCRIPTION OF EMBODIMENTS

An embodiment of the photonic crystal laser according to the present invention will be described with reference to FIGS. 2 to 14.

Figure 1A:
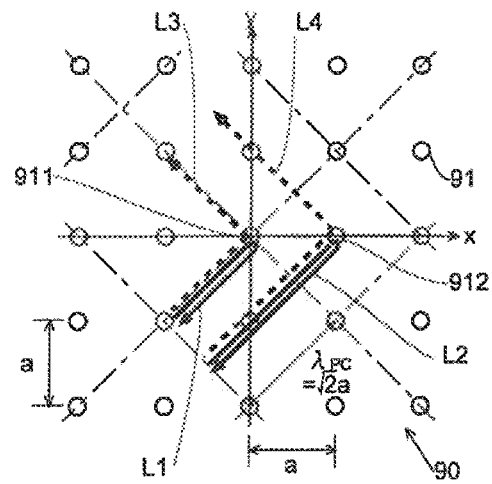
FIG. 1A is a diagram for explaining that a basic two-dimensional lattice amplifies light of a wavelength $\lambda_L$.
Figure 1B:
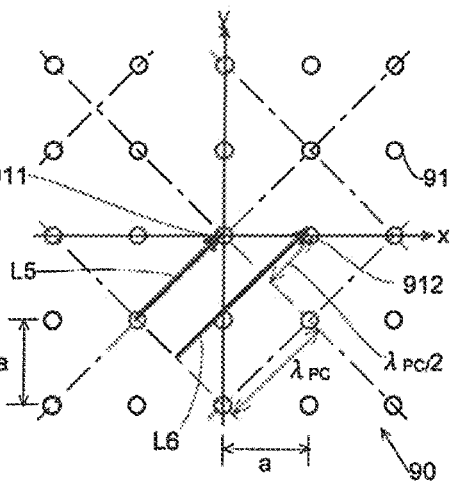
FIG. 1B is a diagram for explaining a reason why light of the wavelength $\lambda_L$ is not emitted to the outside.
Figure 2:
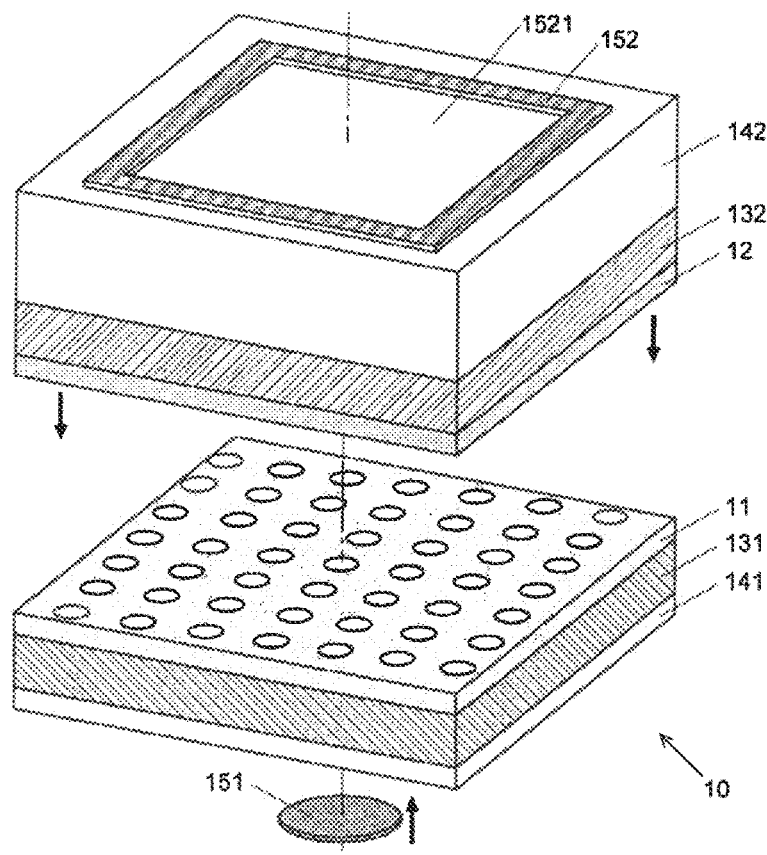
FIG. 2 is a schematic configuration diagram showing an embodiment of a photonic crystal laser according to the present invention.

FIG. 2 is a perspective view of a photonic crystal laser 10 of the present embodiment. The photonic crystal laser 10 includes a lower electrode 151, a lower substrate 141, a lower cladding layer 131, a two-dimensional photonic crystal layer 11, an active layer (light emitting layer) 12, an upper cladding layer 132, an upper substrate 142, and an upper electrode 152 which are stacked in this order. However, the order of the two-dimensional photonic crystal layer 11 and the active layer 12 may be reversed to that described above. Note that, although FIG. 2 shows the two-dimensional photonic crystal layer 11 and the active layer 12 separately in order to show a configuration of the two-dimensional photonic crystal layer 11, they are actually in contact with each other. Similarly, the lower substrate 141 and the lower electrode 151 are also in contact with each other. In the present application, for convenience, the terms "upper" and "lower" are used, but these terms do not actually define directions (upper and lower) when the photonic crystal laser is actually used. Further, a member, such as a spacer, may be inserted between the two-dimensional photonic crystal layer 11 and the active layer 12.

First, a configuration of each layer other than the two-dimensional photonic crystal layer 11 will be described. The active layer 12 corresponds to the light emitting layer, and when electric charges are injected by passing a current between the lower electrode 151 and the upper electrode 152, light of a wavelength within a predetermined wavelength range corresponding to a material of the active layer 12 is emitted. For the active layer 12, for example, one having a Multiple-Quantum Well (MQW) including indium gallium arsenide/gallium arsenide (InGaAs/GaAs) can be used. The active layer 12 emits light of a wavelength in the range of 960 to 990 nm. A p-type semiconductor is used for the lower cladding layer 131 and the lower substrate 141, and an n-type semiconductor is used for the upper cladding layer 132 and the upper substrate 142. For example, p-type semiconductor gallium arsenide (GaAs) can be used for the lower substrate 141, n-type GaAs can be used for the upper substrate 142, p-type semiconductor aluminum gallium arsenide (AlGaAs) can be used for the lower cladding layer 131, and n-type AlGaAs can be used for the upper cladding layer 132. Note that, an n-type semiconductor may be used for the lower cladding layer 131 and the lower substrate 141, and a p-type semiconductor may be used for the upper cladding layer 132 and the upper substrate 142.

In the present embodiment, one provided with a window (cavity) 1521 provided at the center of a film made from metal, such as gold, is used for the upper electrode 152. A laser beam generated by the photonic crystal laser 10 is emitted out of the photonic crystal laser 10 through the window 1521. As the upper electrode 152, a transparent electrode made from indium tin oxide (ITO) or the like may be used instead of the one having the window 1521. In the present embodiment, a film made from metal, such as gold, whose area is smaller than that of the window 1521 of the upper electrode 152 is used for the lower electrode 151. A shape of the lower electrode 151 is circular in the present embodiment, but is not considered in particular.

Figure 3:
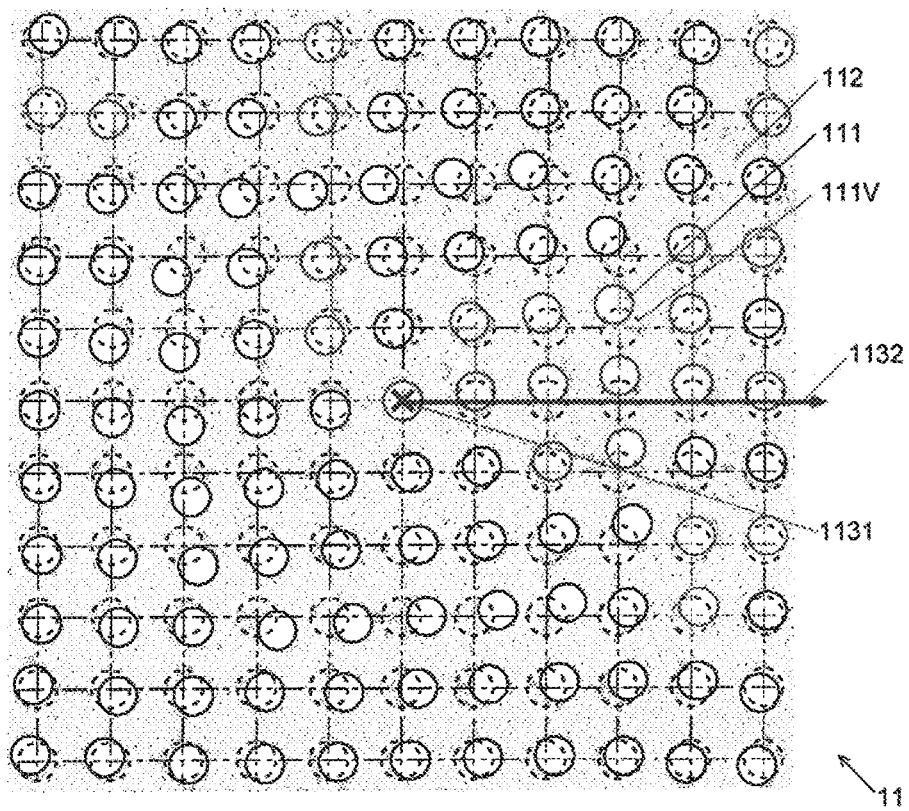
FIG. 3 is a top view showing a two-dimensional photonic crystal layer in the photonic crystal laser of the present embodiment.

Next, a configuration of the two-dimensional photonic crystal layer 11 will be described. As shown in FIG. 3, the two-dimensional photonic crystal layer 11 is a plate-shaped base material (slab) 112 in which a hole (different refractive index region) 111 is arranged as described later. In the present embodiment, p-type GaAs is used as a material of the base material 112. A shape of the holes 111 is circular in the present embodiment.

Figure 4:
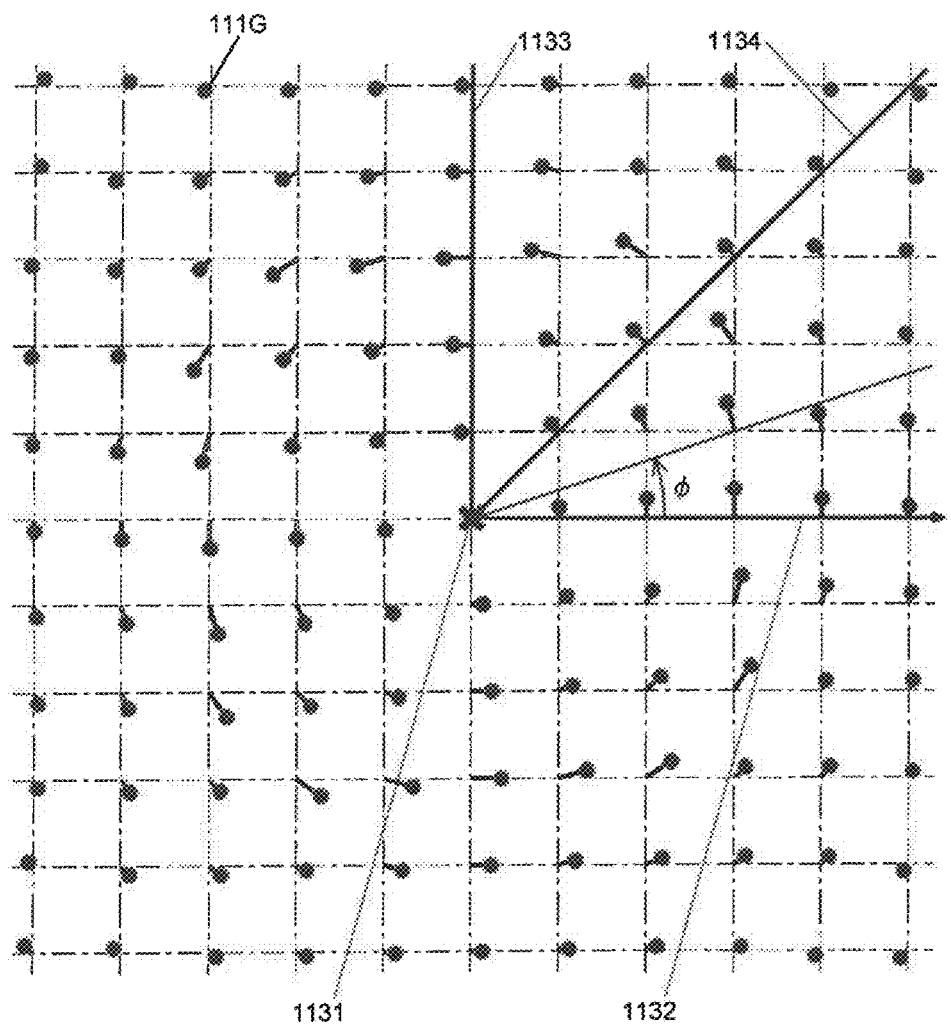
FIG. 4 is a partially enlarged view showing a center of gravity of a square lattice which is a basic two-dimensional lattice and a hole in the two-dimensional photonic crystal layer of the photonic crystal laser of the present embodiment.

The arrangement of the hole 111 in the base material 112 will be described with reference to FIGS. 3 and 4. In the present embodiment, the basic two-dimensional lattice is a square lattice. FIG. 3 is a top view of the two-dimensional photonic crystal layer 11. In this diagram, the hole 111 actually provided on the two-dimensional photonic crystal layer 11 is indicated by a solid line, a square lattice, which is the basic two-dimensional lattice, is indicated by an alternate long and short dashed line, and a broken line indicates a state in which the center of gravity of a hole 111V is disposed virtually at a lattice point of the square lattice. Further, as described later, an origin 1131 serving as a reference for determining the position of the hole 111 is indicated by a cross, and a reference line 1132, which is a straight line extending in one direction from the origin, is indicated by a solid arrow. The origin 1131 is an arbitrary one of lattice points of the basic two-dimensional lattice, and the reference line 1132 is a line parallel to one of lattice lines orthogonal to each other of the square lattice. FIG. 4 shows only the square lattice (alternate long and short dashed line), a center of gravity 111G (black circle) of the hole 111, the origin 1131, and the reference line 1132.

The lattice constant a of the basic two-dimensional lattice is preferably determined so as to be $a=2^{-1/2}\lambda_L/n_{eff}$, after selecting the wavelength $\lambda_L$ for laser oscillation from the wavelength range of 960 to 990 nm in which the active layer 12 emits light. Here, the lattice constant a is preferably determined based on a ratio (filling factor) of the volume occupied by the hole 111 in the two-dimensional photonic crystal layer 11 and a refractive index of a material of the base material 112. In the present embodiment, the effective refractive index $n_{eff}$ of the two-dimensional photonic crystal layer 11 is 3.4.

In the present embodiment, in order to obtain a radially polarized annular laser beam, in Equation (1) described above, L=+1, $\varphi_0$=90°. Further, a spread angle θ of the laser beam is an arbitrary value (for example, θ=1°). The azimuth angle φ at each lattice point is represented by an angle formed by a straight line connecting the origin 1131 and the lattice point with respect to the reference line 1132 (FIG. 4).

Since the basic two-dimensional lattice is a square lattice, the reciprocal lattice vector G'↑ for each lattice point is obtained by substituting values of the effective refractive index $n_{eff}$ and the azimuth angle φ at the lattice point into Equation (2). Then, the positional shift vector Δr↑ for each lattice point is obtained by substituting L=1 and $\varphi_0$=90°, and the position vector r↑ and the reciprocal lattice vector G'↑ for each lattice point into Equation (1). Note that the value of d in Equation (1) is arbitrary.

From Equation (1), a direction of the positional shift vector Δr↑ is generally determined by a vector (cos(L(φ+$\varphi_0$)), sin(L(φ+$\varphi_0$)), and is determined by a vector (cos(φ+π/2), sin(φ+π/2)) in the present embodiment. Therefore, in the present embodiment, the center of gravity 111G of the hole 111 is disposed at a position shifted in a direction rotated by (φ+π/2) radians, that is, (φ+90°) from the direction of the reference line at each lattice point (FIG. 4). For example, the center of gravity 111G of the hole 111 is disposed at a position shifted from a lattice point in a direction perpendicular to the reference line 1132 for a lattice point (φ=0°) on the reference line 1132, in a direction parallel to the reference line 1132 for a lattice point (φ=90°) on a line 1133 orthogonal to the reference line 1132, and in a direction of φ=135° orthogonal to a line 1134 for a lattice point on the line 1134 crossing the reference line 1132 at an angle of φ=45°. All of these directions of shifts are perpendicular to the straight line connecting the origin and the lattice point.

On the other hand, a distance of a shift of the center of gravity 111G of the hole 111 from the lattice point is determined by d sin(G'↑·r↑). Since G'↑ and r↑ are vectors different for each lattice point, the distance of a shift from the lattice point is also a value different for each lattice point.

Since the hole 111 is disposed at a position shifted from a lattice point as described above at each lattice point, the laser beam generated by the photonic crystal laser 10 becomes a radially polarized annular laser beam. Hereinafter, the reason for the above will be described.

(a) Reason Why the Laser Beam becomes Radially Polarized Light

First, unlike the present embodiment, a case where the holes 111 are shifted in the same direction at all lattice points will be examined. In the upper diagram of FIG. 5, at all the lattice points, vectors (cos(L(φ+$\varphi_0$)), sin(L(φ+$\varphi_0$))) representing directions of shifts of the holes 111 are not dependent on the azimuth angle φ of each lattice point.

In place of a vector, an example in which θ is 30°, φ is 0°, and $\psi_0$ is 0° in a factor d sin(±G'↑·r↑+$\psi_0$) representing the magnitude of a shift is shown. The direction of a shift of the hole 111 is the y direction in FIG. 5A, a direction of +45° with respect to the x direction in FIG. 5B, and the x direction in FIG. 5C. All of these examples are the same as the example described in Patent Literature 2. As a result, a laser beam having linearly polarized light in the x direction in FIG. 5A, the direction of +45° with respect to the y direction in FIG. 5B, and the y direction in FIG. 5C with respect to the direction of a shift of the hole 111 is obtained, and in all the examples, the linearly polarized light is in a direction of +90° with respect to the direction of a shift of the hole 111 (lower diagram in FIG. 5).

Next, unlike the present embodiment and the example of FIG. 5 described above, FIG. 6 shows a result of photographing an obtained laser beam in a cross section parallel to the two-dimensional photonic crystal layer in a case where directions of shifting the holes 111 from lattice points are set to be the same (here, the x direction) in all lattice points, and the angle φ in the factor d sin(±G'⊔·r↑+$\psi_0$) representing the magnitude of a shift is different (the angle θ is the same). In any of cases where the azimuth angle φ in the factor d sin(±G'↑·r↑+$\psi_0$) is (a) 0°, (b) 45°, and (c) 90°, a laser beam having an inclination angle with respect to a normal line of a two-dimensional photonic crystal layer at the angle θ and an azimuth angle at φ is shown to be emitted.

Figure 6A:
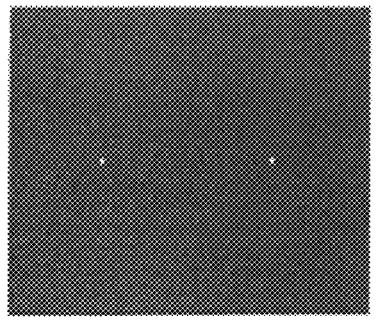
FIG. 6 is a photograph showing a spot of a laser beam for three examples in which the inclination angle θ and the directions of the shift of the holes are the same and the values of the azimuth angle φ are different.
Figure 6B:
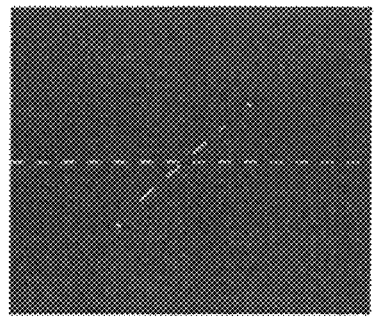
Figure 6C:
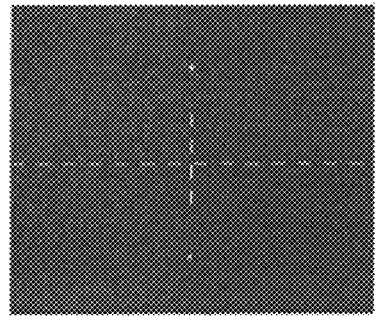
Figure 7:
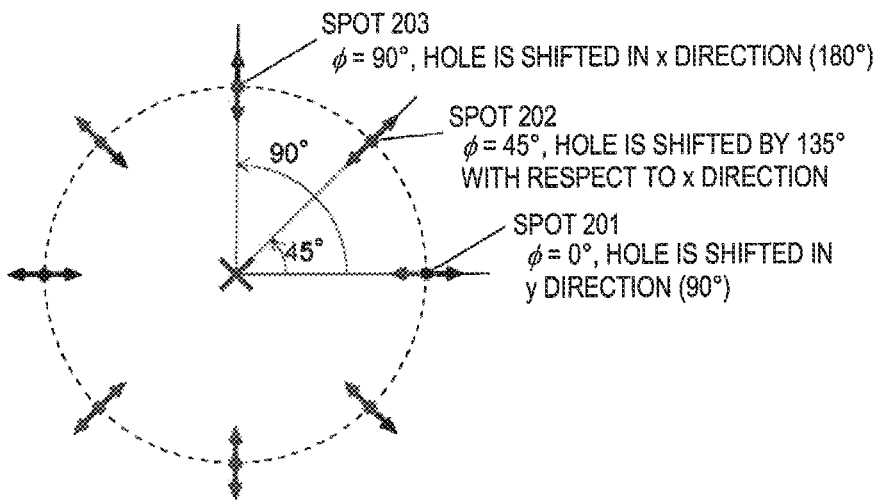
FIG. 7 is a diagram for explaining that a radial annular laser beam can be obtained in the photonic crystal laser of the present embodiment.

When the results of FIGS. 5 and 6 are combined, a conclusion described below can be drawn. When the azimuth angle φ is 0° (FIG. 6A) and the direction of a shift of the hole 111 is the y direction (90°, FIG. 5A), as shown in FIG. 7, a spot 201 of a laser beam in a cross section parallel to the two-dimensional photonic crystal layer appears in a direction in which the azimuth angle φ is 0°, and its polarization is in the x direction (0°). Similarly, in a case where the azimuth angle φ is 45° (FIG. 6B) and the direction of a shift of the hole 111 is 135° with respect to the x direction (FIG. 5B), a spot 202 of the laser beam in the cross section appears in a direction in which the azimuth angle φ is 45°, and its polarization is in a direction at 45° with respect to the x direction. Further, in a case where the azimuth angle φ is 90° (FIG. 6C) and the direction of a shift of the hole 111 is the x direction (180°, FIG. 5C), a spot 203 of the laser beam in the cross section appears in a direction in which the azimuth angle φ is 90°, and its polarization is in the y direction (90°). In any spot, the polarization is in the same direction as the direction connecting the origin and the spot.

Therefore, when the spots of these laser beams are collected within a range of the azimuth angles from 0° to 360°, a laser beam having a cross section of a ring shape is formed (a broken line in FIG. 7). Further, by setting the direction in which the hole 111 shifts from a lattice point to be a direction of 90° with respect to the direction connecting the origin and the spot, the direction of polarization in each spot is the same as the direction connecting the origin and the spot, that is, the radial direction. That is, by combining these conditions, a radially polarized annular laser beam can be obtained. The photonic crystal laser 10 of the present embodiment satisfies the above conditions by changing a value of the azimuth angle φ in Equations (1) and (2) within the range of 0° to 360° for each lattice point, and shifting the hole 111 from a lattice point in a direction of 90° with respect to the direction connecting the origin and the spot by the vector (cos(φ+π/2), sin(φ+π/2)) that specifies the direction of the positional shift vector Δr↑, and a radially polarized annular laser beam can be obtained.

Figure 8:
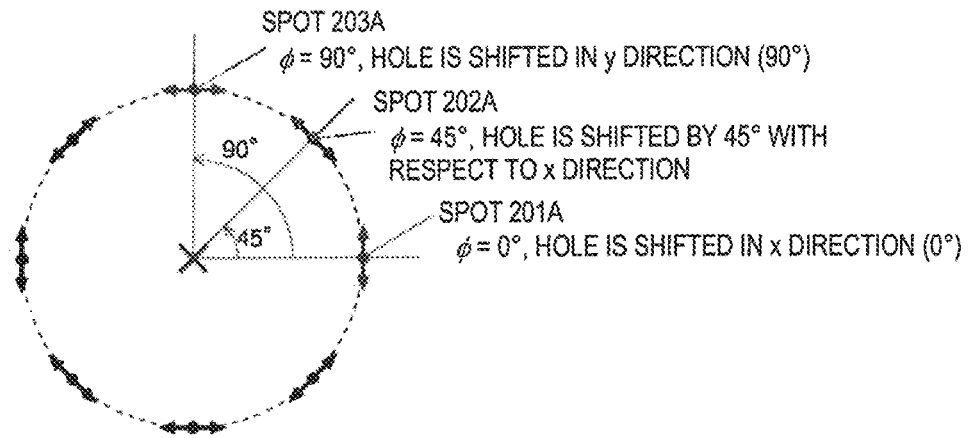
FIG. 8 is a diagram for explaining that a circumferential annular laser beam is obtained.

Similarly, as shown in FIG. 8, if the azimuth angle φ is 0° (FIG. 6A) and the direction of a shift of the hole 111 is the x direction (FIG. 5C), a spot 201A of a laser beam appears in the direction in which the azimuth angle φ is 0°, polarization is y polarization (90°), if the azimuth angle φ is 45° (FIG. 6B) and the direction of a shift of the hole 111 is in the direction of 45° (FIG. 5B) with respect to the x direction, a spot 202A of a laser beam appears in the direction in which the azimuth angle φ is 45° and the polarization is 135° with respect to the x direction, and if the azimuth angle φ is 90° (FIG. 6C) and the direction of a shift of the hole 111 is the y direction (FIG. 5A), a spot 203A of a laser beam appears in the direction in which the azimuth angle φ is 90°, and becomes x-polarization (180°). Therefore, when spots of laser beams with different azimuth angles φ within the range of 0° to 360° are collected, a laser beam having a cross section of a ring shape is formed (a broken line in FIG. 8). Further, the polarization direction is the circumferential direction of the ring. Therefore, the laser beam obtained in this example is an azimuthally polarized annular laser beam. The conditions mentioned here correspond to the case where L=+1, φ$_0$=0° in Equation (1).

Figure 9:
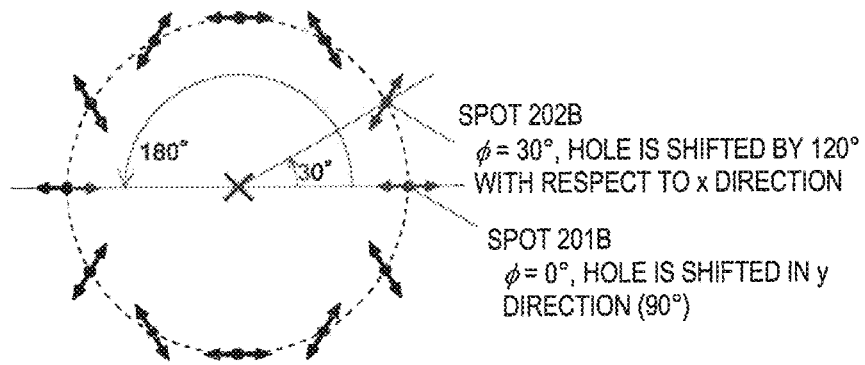
FIG. 9 is a diagram showing a direction of polarization of an annular laser beam in a case of L=2, $\varphi_0=90°$.

Further, when the value of L is an integer other than +1 (the above embodiment) and 0 (out of the range of the present invention), an annular laser beam having polarization corresponding to the value of L can be obtained. FIG. 9 shows a direction of polarized light by an arrow in a case of L=+2 and φ$_0$=90°. In a case where φ=0° and the direction of a shift of the hole 111 is the y direction (90°), in an obtained spot 201B, the polarized light is in the x direction as in FIG. 7, and this direction is the radial direction. In contrast, as the value of φ increases, the direction of polarized light rotates by 2φ. For example, in a case where φ=30° and the direction of a shift of the hole 111 is 120° with respect to the x direction, the polarized light is rotated by 2φ with respect to the x direction, that is, 60° in an obtained spot 202B. Therefore, every time φ increases by 180°, a direction of polarized light rotates 360° and becomes the same direction as when φ=0°. Then, the polarized light is rotated twice by the time φ increases by 360°. Similarly, in a case where L is +3 or more, the direction of the polarized light is rotated 360° every time φ increases by (360/L)°, and becomes the same direction as when φ=0°, and the polarized light is rotated L times by the time φ increases by 360°. On the other hand, in a case where L has a negative value, as φ increases, the direction of polarized light rotates in the opposite direction to a case where L has a positive value.

Figure 10A:
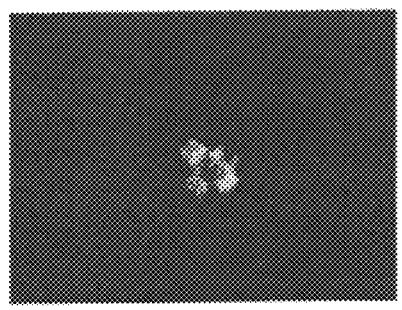
FIG. 10 is a photograph showing a cross section of a laser beam obtained by the photonic crystal laser of the present embodiment for a case of (a) L=+1, $\varphi_0=90°$ and (a) L=−1, $\varphi_0=90°$.

FIG. 10 shows a photograph of a cross section of a laser beam obtained by the photonic crystal laser 10 manufactured as (a) L=+1, φ$_0$=90° (that is, conditions for obtaining a radially polarized annular laser beam), and (b) L=−1, φ$_0$=90°. The spread angle θ is 1° in all cases. In all the cases, a laser beam having a cross section of a ring shape is obtained. Note that, in the condition (a), since light emission (side lobe) appears also on the outside of the ring of the cross section, FIG. 10A shows a photograph in which the side lobe is blocked. No side lobe appears in (b).

Figure 10B:
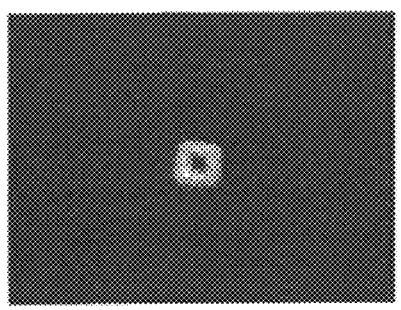
Figure 11A:
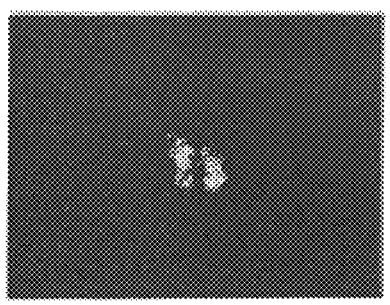
FIG. 11 is a photograph of a cross section of a laser beam which has passed through a polarizing element taken for a plurality of examples with different directions of the polarizing element for the case of L=+1, $\varphi_0=90°$ and a diagram of the explanation.
Figure 11A:
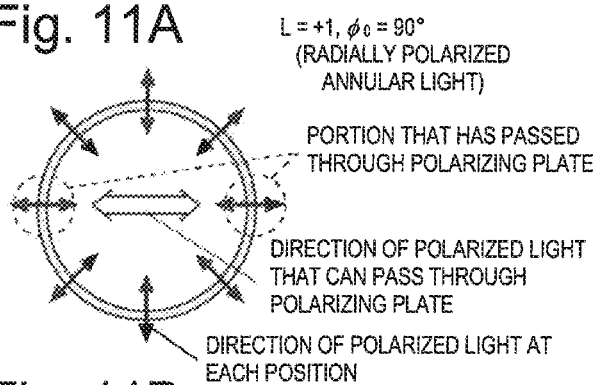
Figure 11B:
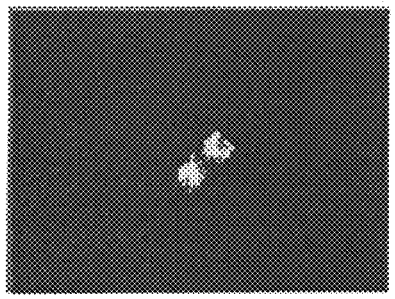
Figure 11B:
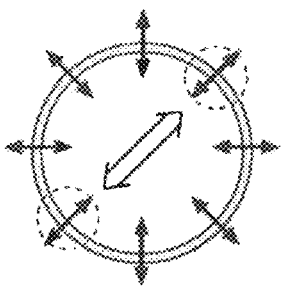
Figure 11C:
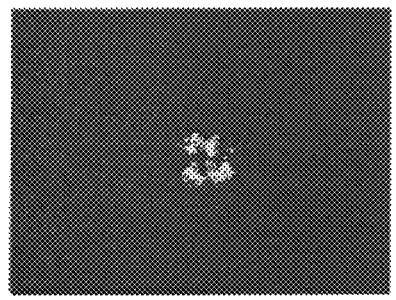
Figure 11C:
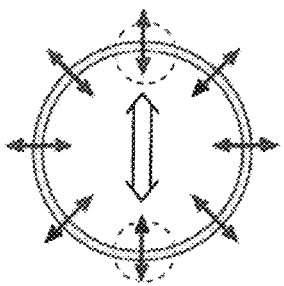
Figure 11D:
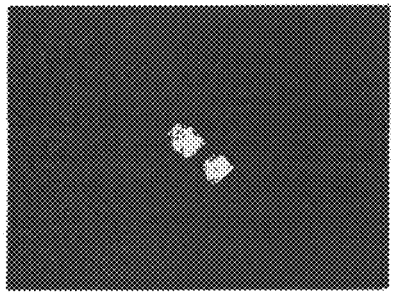
Figure 11D:
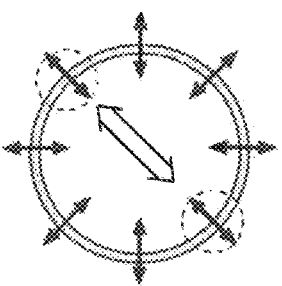
Figure 12A:
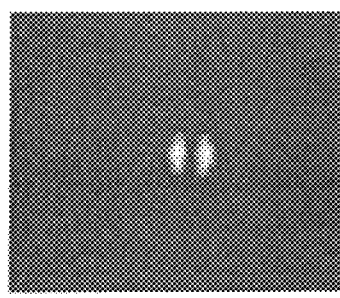
FIG. 12 is a photograph of a cross section of a laser beam which has passed through a polarizing element taken for a plurality of examples with different directions of the polarizing element for the case of L=−1, $\varphi_0=90°$ and a diagram of the explanation.
Figure 12A:
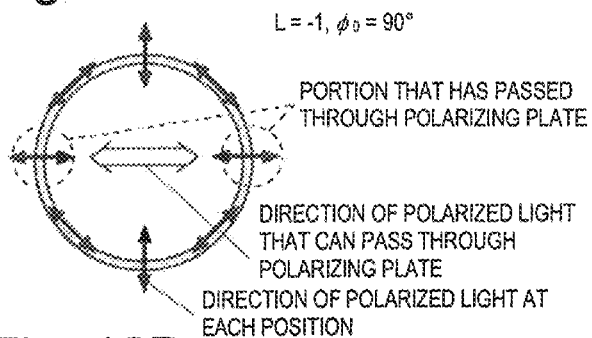
Figure 12B:
Figure 12B:
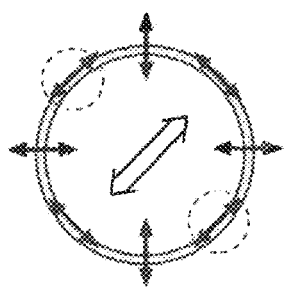
Figure 12C:
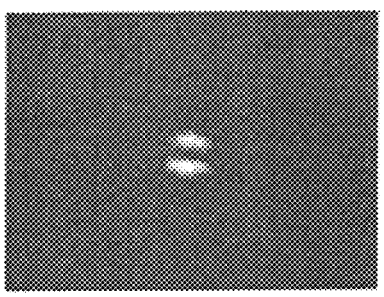
Figure 12C:
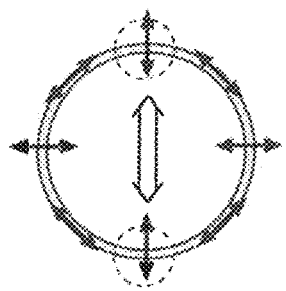
Figure 12D:
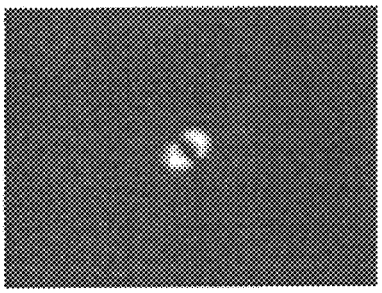
Figure 12D:
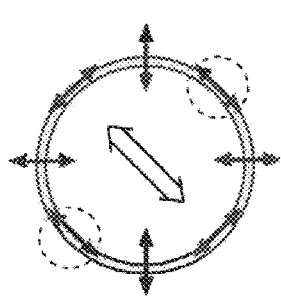

For the laser beams in the cases of L=+1, φ$_0$=90° and L=−1, φ$_0$=90° shown in FIGS. 10A and 10B, the photograph is taken by passing the laser beam through the polarizing element, and changing an orientation of the polarizing element. The results are shown in FIG. 11 for the case of L=+1 and φ$_0$=90° and in FIG. 12 for the case of L=−1 and φ$_0$=90°. FIG. 11 and FIG. 12 show four photographs different in the orientation of the polarizing element on the left side. The right side of each of the diagrams shows a direction of polarized light that can pass through the polarizing element in a manner corresponding to each of the four photographs by an outlined arrow, and a direction of polarized light that can be assumed from design (values of L and φ$_0$) at each position of a cross section of a ring shape of a laser beam by a black arrow. Further, a portion where the direction of polarized light that can pass through the polarizing element matches with the assumed direction of polarized light is shown by enclosing with a broken line. In either cases of FIG. 11 and FIG. 12, a position of a portion where light appears in the photograph on the left matches with a position of a portion enclosed by a broken line in the diagram on the right. From this result, an annular laser beam having polarized light as designed is considered to be obtained.

Figure 13A:
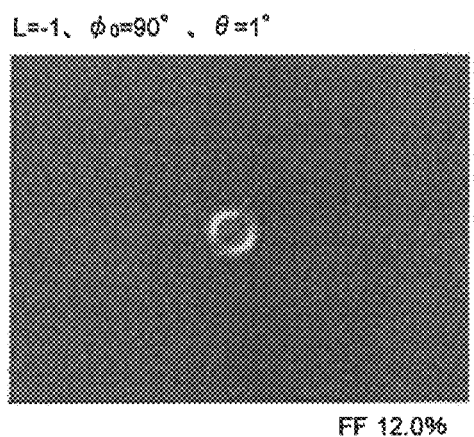
FIG. 13 is a photograph of a cross section of a laser beam obtained by the photonic crystal laser of the present embodiment, for two examples where L=−1, $\varphi_0=90°$ and a spread angle θ is different.
Figure 13B:
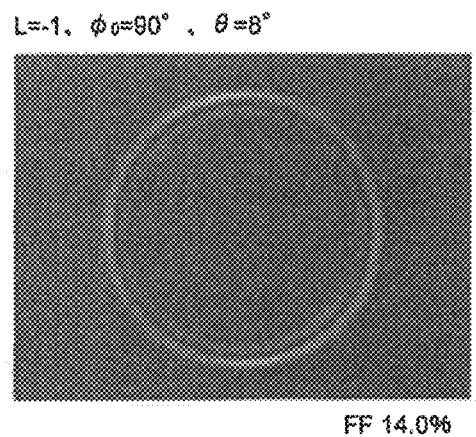

FIGS. 13A and 13B show photographs of cross sections of the laser beams obtained by two of the photonic crystal lasers 10 having the spread angles θ different from each other in the case of L=−1 and φ$_0$=90°. The spread angle θ is set to 1° in FIG. 13A and 8° in FIG. 13B. A filling factor (FF) is 12.0% in FIG. 13A and 14.0% in FIG. 13B. The other parameters are common between FIGS. 13A and 13B, the lattice constant a is 206 nm, and a diameter of the lower electrode 151 and a thickness of each layer are common between both. FIGS. 13A and 13B are shown on the same scale, and FIG. 13A with a smaller spread angle θ is shown to have a smaller wheel diameter.

Figure 14:
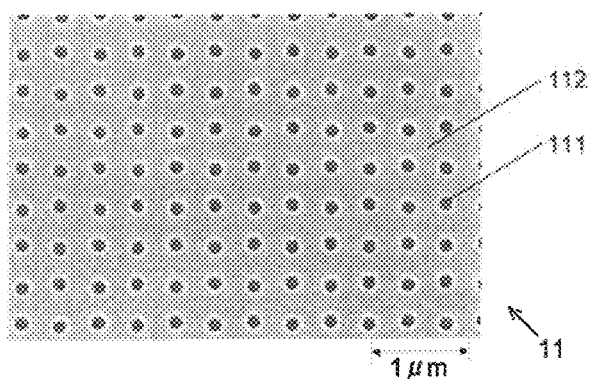
FIG. 14 is an SEM photograph showing an example of a produced two-dimensional photonic crystal layer for the photonic crystal laser of the present embodiment.
Figure 15A:
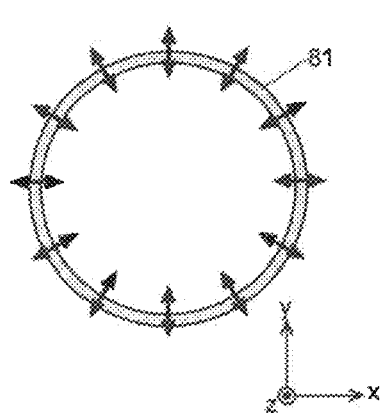
FIG. 15 is a diagram schematically showing a cross section (a) perpendicular to the radially polarized annular laser beam and one cross section (b) parallel to the radially polarized annular laser beam.
Figure 15B:
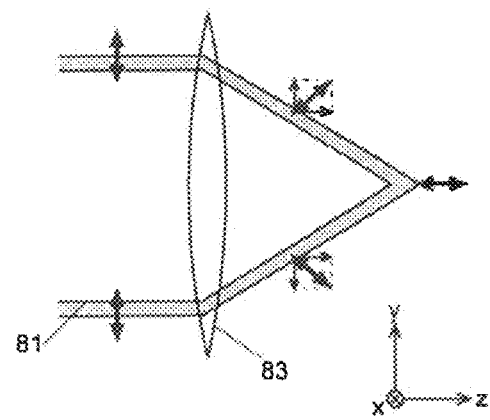

FIG. 14 shows an example of the produced two-dimensional photonic crystal layer 11 by an SEM photograph for the photonic crystal laser 10 of the present embodiment. In this example, L=+1 and φ$_0$=90°. Each of the holes 111 is disposed at a position shifted from the lattice point of the square lattice, and a direction and size of the shift is different for each of the holes 111.

The present invention is not limited to the above embodiment. For example, although the shape of the hole (different refractive index region) 111 is circular in the above embodiment, it may be various shapes, such as an equilateral triangle or another triangle, a polygon including a triangle, or an ellipse. Further, instead of the hole 111, a member (different refractive index member) having a refractive index different from a refractive index of the base material 112 may be used for the different refractive index region. While a hole is excellent in that it can be easily processed, the different refractive index member is advantageous in a case where there is possibility that the base material is deformed by heating or the like at the time of processing. Furthermore, the basic two-dimensional lattice is not limited to the square lattice, and a triangular lattice, a rectangular lattice, or the like may be used. In a case of using a triangular lattice or a rectangular lattice, the positional shift vector Δr↑ obtained by substituting the reciprocal lattice vector G'↑ shown in any of Equations (3) to (5) into Equation (1) is preferably used to set a position of the different refractive index region.

INDUSTRIAL APPLICABILITY

The photonic crystal laser according to the present invention can obtain an annular laser beam having desired polarization distribution, and can have a large output power since it can resonate in a large area, and has an oscillation mode called TE mode. Due to these excellent features, the photonic crystal laser according to the present invention can be suitably used in many devices, such as a high resolution microscope, various measuring instruments and analyzers, a laser processing machine, and an OCT diagnostic device.

REFERENCE SIGNS LIST

10 . . . Photonic Crystal Laser
11 . . . Two-dimensional Photonic Crystal Layer
111, 111V . . . Hole (Different Refractive Index Region)
111G . . . Center of Gravity
112 . . . Base Material
1131 . . . Origin
1132 . . . Reference Line
1133 . . . Line Orthogonal to Reference Line
1134 . . . Line Crossing Reference Line at Angle of 45°
12 . . . Active Layer (Light Emitting Layer)
131 . . . Lower Cladding Layer
132 . . . Upper Cladding Layer
141 . . . Lower Substrate
142 . . . Upper Substrate
151 . . . Lower Electrode
152 . . . Upper Electrode
1521 . . . Window of Upper Electrode
201, 201A, 201B, 202, 202A, 202B, 203, 203A . . . Spot of Laser Beam
81 . . . Cross Section of Radially Polarized Annular Laser Beam
83 . . . Lens
90 . . . Basic Two-dimensional Lattice
91, 911, 912 . . . Lattice Point

The invention claimed is:

1. A photonic crystal laser having a configuration, in which a light emitting layer that generates light including light of wavelength $\lambda_L$, and a two-dimensional photonic crystal layer including different refractive index regions disposed two-dimensionally on a plate-like base material, the different refractive index regions having a refractive index different from a refractive index of the plate-like base material, so that refractive index distribution is formed, are stacked, wherein
  each different refractive index region in the two-dimensional photonic crystal layer is disposed at a position shifted from each lattice point of a basic two-dimensional lattice that has periodicity defined to generate a resonant state of light of the wavelength $\lambda_L$ by forming a two-dimensional standing wave and not to emit light of the wavelength $\lambda_L$ to outside, and
  magnitude of a shift of a position of a different refractive index region at the each lattice point from the lattice point has modulation in which the magnitude of the shift changes in a predetermined period from a predetermined origin of the basic two-dimensional lattice in a radial direction and in a predetermined period from the predetermined origin in a circumferential direction, and a direction of the shift from the lattice point is different depending on a direction of a straight line connecting the origin and the lattice point.

2. The photonic crystal laser according to claim 1, wherein a planar shape of the different refractive index region is a circle, an ellipse, or a polygon with three or more vertices.

3. The photonic crystal laser according to claim 2, wherein a planar shape of the different refractive index region is a circle or a polygon with six or more vertices.

4. A photonic crystal laser having a configuration, in which a light emitting layer that generates light including light of wavelength $\lambda_L$, and a two-dimensional photonic crystal layer including different refractive index regions disposed two-dimensionally on a plate-like base material, the different refractive index regions having a refractive index different from a refractive index of the plate-like base material, so that refractive index distribution is formed, are stacked, wherein
  each different refractive index region in the two-dimensional photonic crystal layer is disposed at a position shifted from each lattice point of a basic two-dimensional lattice that has periodicity defined to generate a resonant state of light of the wavelength $\lambda_L$ by forming a two-dimensional standing wave and not to emit light of the wavelength $\lambda_L$ to outside, and
  a positional shift vector $\Delta \vec{r}$ representing a shift of a position of a different refractive index region at the each lattice point from the lattice point is expressed by $$\Delta \vec{r} = d \cdot \sin(\pm \vec{G'} \cdot \vec{r} + \psi_0) \cdot (\cos(L(\varphi+\varphi_0)), \sin(L(\varphi+\varphi_0)))$$

by using a wave number vector $\vec{k}=(k_x, k_y)$ of light of the wavelength $\lambda_L$ in the two-dimensional photonic crystal layer, an effective refractive index $n_{eff}$ of the two-dimensional photonic crystal layer, an azimuth angle $\varphi$ from a predetermined reference line extending in a predetermined direction from a predetermined origin of the basic two-dimensional lattice, an arbitrary constant $\varphi_0$, and a reciprocal lattice vector $\vec{G'}=\pm(k_x \pm |\vec{k}|(\sin\theta \cos\varphi)/n_{eff}, k_y \pm |\vec{k}|(\sin\theta\sin\varphi)/n_{eff})$ expressed by using a spread angle $\theta$ of a laser beam, the position vector $\vec{r}$ of the each lattice point, arbitrary constants d and $\psi_0$, and an integer L excluding 0.

5. The photonic crystal laser according to claim 4, wherein a value of L is +1 and a value of $\varphi_0$ is 90°.

6. The photonic crystal laser according to claim 5, wherein a planar shape of the different refractive index region is a circle, an ellipse, or a polygon with three or more vertices.

7. The photonic crystal laser according to claim 6, wherein a planar shape of the different refractive index region is a circle or a polygon with six or more vertices.

8. The photonic crystal laser according to claim 4, wherein a planar shape of the different refractive index region is a circle, an ellipse, or a polygon with three or more vertices.

9. The photonic crystal laser according to claim 8, wherein a planar shape of the different refractive index region is a circle or a polygon with six or more vertices.

* * * * *